(12) United States Patent  (10) Patent No.: US 8,766,531 B1
Hack et al.                (45) Date of Patent:     Jul. 1, 2014

(54) WEARABLE DISPLAY

(71) Applicants: Michael Hack, Princeton, NJ (US);
 Ruiqing Ma, Morristown, NJ (US);
 Huiqing Pang, Newtown, PA (US)

(72) Inventors: Michael Hack, Princeton, NJ (US);
 Ruiqing Ma, Morristown, NJ (US);
 Huiqing Pang, Newtown, PA (US)

(73) Assignee: Universal Display Corporation, Ewing, NJ (US)

(*) Notice: Subject to any disclaimer, the term of this patent is extended or adjusted under 35 U.S.C. 154(b) by 0 days.

(21) Appl. No.: 13/715,135

(22) Filed: Dec. 14, 2012

(51) Int. Cl.
 *H01L 51/52* (2006.01)

(52) U.S. Cl.
 USPC .......................................... 313/504; 313/511

(58) Field of Classification Search
 CPC ........ H05B 33/02; H05B 33/12; H05B 33/00; H01L 51/5036; H01L 2251/5338; H01L 27/3206; H01L 51/5281; H01L 51/50; H01L 51/504; H01L 33/504; H01L 51/5262; F21Y 2105/008; B29L 2031/3481; F21V 33/0008; G02F 1/1336; G02F 1/133611
 USPC ................................................. 313/498–512
 See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,279,704 B2 | 10/2007 | Walters et al. | |
| 7,431,968 B1 | 10/2008 | Shtein et al. | |
| 7,751,285 B1 | 7/2010 | Cain | |
| 7,844,310 B2 | 11/2010 | Anderson | |
| 7,968,146 B2 | 6/2011 | Wagner et al. | |
| 2001/0004190 A1* | 6/2001 | Nishi et al. | 313/506 |
| 2002/0084746 A1* | 7/2002 | Anzai | 313/504 |
| 2003/0170491 A1* | 9/2003 | Liao et al. | 428/690 |
| 2003/0230980 A1 | 12/2003 | Forrest et al. | |
| 2004/0174116 A1 | 9/2004 | Lu et al. | |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

Baldo et al.,"Highly efficient phosphorescent emission from organic electroluminescent devices", Nature, vol. 395, pp. 151-154, 1998.

(Continued)

*Primary Examiner* — Donald Raleigh
(74) *Attorney, Agent, or Firm* — Morris & Kamlay LLP

(57) ABSTRACT

OLED displays capable of operation at a sunlight readable luminance value are disclosed. Devices as disclosed may be wearable such that the display is flexible and the operating temperature rise due to the display operation is below a threshold. Displays with an operating power consumption density of not more than 65 mW/cm$^2$ when operating at 78 mW/cm$^2$ at 100% full white are also provided.

55 Claims, 4 Drawing Sheets

(56) References Cited

U.S. PATENT DOCUMENTS

| | | | |
|---|---|---|---|
| 2005/0093433 A1* | 5/2005 | Ko | 313/504 |
| 2007/0273281 A1* | 11/2007 | Biebel | 313/512 |
| 2009/0026943 A1* | 1/2009 | Yuki | 313/505 |
| 2010/0259159 A1* | 10/2010 | Seaman | 313/498 |
| 2011/0248626 A1* | 10/2011 | Matsudate et al. | 313/504 |
| 2012/0056169 A1* | 3/2012 | Kaiser et al. | 257/40 |
| 2012/0286305 A1* | 11/2012 | Sasaki et al. | 257/89 |
| 2013/0020933 A1* | 1/2013 | Levermore et al. | 313/504 |
| 2013/0113843 A1* | 5/2013 | Yamazaki | 345/690 |

OTHER PUBLICATIONS

Baldo et al.,"Very high-efficiency green organic light-emitting devices based on electrophosphorescence", Applied Physics Letter, vol. 75, No. 1, pp. 4-6, 1999.

Ma et al.,"Wearable 4-inch QVGA Full Color Video Flexible AMOLEDs for Rugged Applications", Society for Information Display Digest, Paper 10.1, 2009.

* cited by examiner

WEARABLE DISPLAY

The claimed invention was made by, on behalf of and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices and, more specifically, to devices suitable for use in wearable displays and other devices capable of sunlight-readability.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

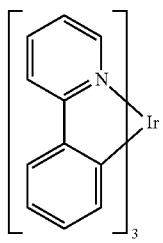

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A wearable device is provided that includes a flexible display including a phosphorescent emissive layer, and that is capable of operation at a luminance value of at least 700 cd/m$^2$ without exceeding an operating temperature increase of 26° C. The device includes a plurality of pixels with a combined resolution of at least 200 dpi and can further include a second and third emissive layer with a peak emission wavelength different from the first emissive layers. Two or more of the emissive layers may be disposed in a vertical stack with a color filter disposed over them. The device may dim the display to operate at a luminance value of less than 700 cd/m$^2$ based on ambient lighting conditions or on one or more factors such as the amount of battery power available to the device, a user selected setting, a time, a location, a height, or the content displayed on the device. In some configurations, the device may include a touch sensitive surface which may be responsive to multiple touch inputs. A backplane of the display may be fabricated on a thin plastic, thin metal, or thin glass substrate and the display may be encapsulated by a single layer barrier as disclosed herein. Embodiments of the invention may allow for a full color display having an operating power consumption density of not more than about 78 mW/cm$^2$ when operating at 700 cd/m$^2$ at 100% full white. Further, embodiments of the invention may allow for a full color display having an operating power consumption density of not more than about 65 mW/cm$^2$ when operating at 700 cd/m$^2$ at 100% full white.

In an embodiment, a wearable display system operated by a processor may have a flexible display with an organic first emissive layer with a peak wavelength of 580-700 nm operating at an efficiency of 30 cd/A or greater is provided at sunlight readable luminance level. The display system may be sunlight-readable and the system may exhibit an operating temperature rise of 29° C. or less. Embodiments of the invention may allow the full color display system to operate at an efficiency of 45 cd/A at sunlight readable luminance level while exhibiting an operating temperature rise of 26° C. or less. The display system may weigh no more than 140 grams and more preferably 95 grams and include a dimension that is no more than 15 mm and more preferably 8 mm thick. The display system may also contain a thin film battery, an accelerometer, a motion sensor, a position sensor, a light sensor, a solar cell, an orientation sensor or a processor. The display system may enter a power save mode or increase the display brightness based on a sensor.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
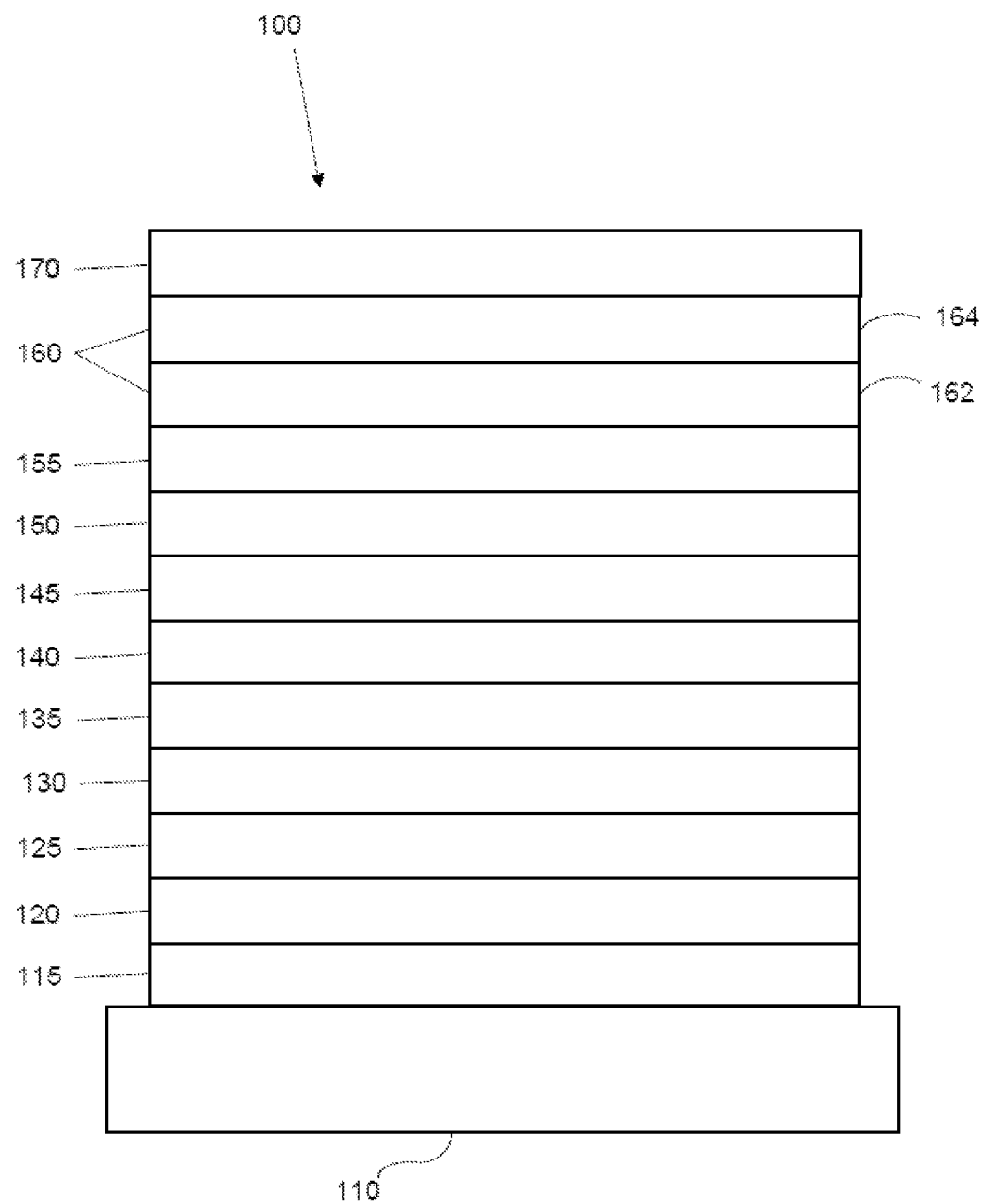
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as MgAg with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
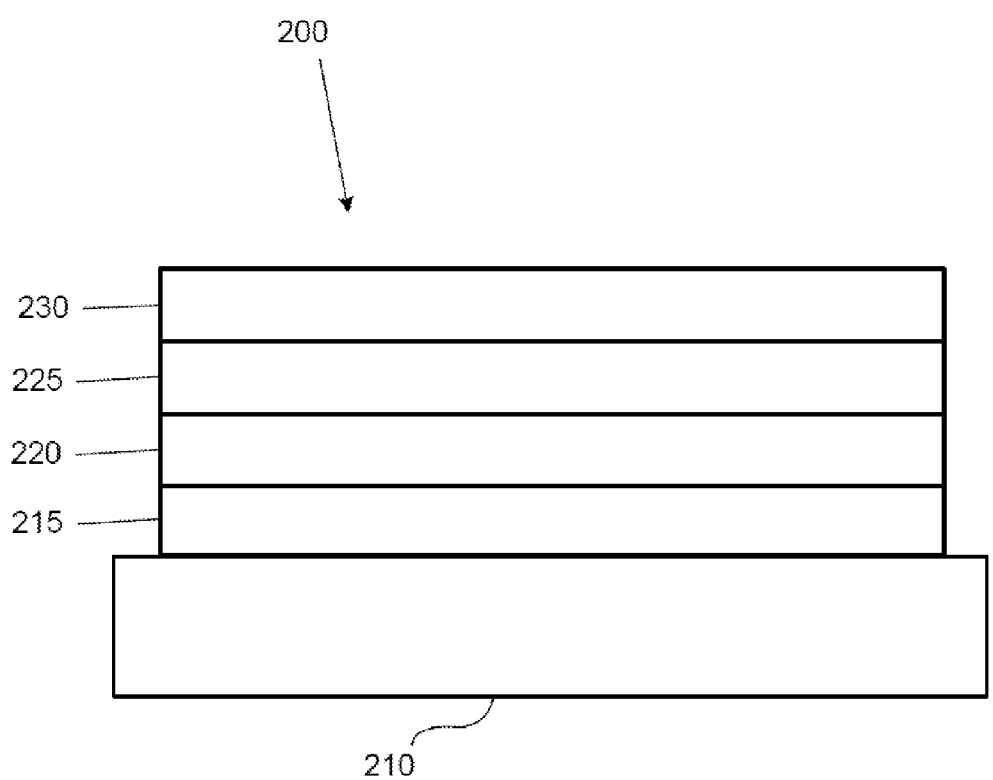
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the present invention may have a first organic light emitting device, a second organic light emitting device, a third organic light emitting device, and a fourth organic light emitting device, such as corresponding to sub-pixels within a pixel of a display. A preferred use of the device is in an active matrix organic light emitting display, in which the shortcomings of blue OLEDs may be a limiting factor.

The first organic light emitting device may emit red light, the second organic light emitting device may emit green light, the third organic light emitting device may emit light blue light, and the fourth organic light emitting device may emit deep blue light. The peak emissive wavelength of the third and fourth devices can differ by at least 4 nm. As used herein, "red" means having a peak wavelength in the visible spectrum of 600-700 nm, "green" means having a peak wavelength in the visible spectrum of 500-600 nm, "light blue" means having a peak wavelength in the visible spectrum of 470-500 nm, and "deep blue" means having a peak wavelength in the visible spectrum of 400-470 nm. In some configurations disclosed herein where a distinction between light and deep blue is not required, "blue" means having a peak wavelength in the visible spectrum of 400-500 nm. Preferred ranges include a peak wavelength in the visible spectrum of 610-640 nm for red and 510-550 nm for green.

To add more specificity to the wavelength-based definitions, "light blue" may be further defined, in addition to having a peak wavelength in the visible spectrum of 470-500 nm that is at least 4 nm greater than that of a deep blue OLED in the same device, and preferably having a CIE x-coordinate less than 0.2 and a CIE y-coordinate less than 0.5, and "deep blue" may be further defined, in addition to having a peak wavelength in the visible spectrum of 400-470 nm, as preferably having a CIE y-coordinate less than 0.15 and preferably less than 0.1, and the difference between the two may be further defined such that the CIE coordinates of light emitted by the third organic light emitting device and the CIE coordinates of light emitted by the fourth organic light emitting device are sufficiently different that the difference in the CIE x-coordinates plus the difference in the CIE y-coordinates is at least 0.01. As defined herein, the peak wavelength is the primary characteristic that defines light and deep blue, and the CIE coordinates are preferred.

A device or pixel having four organic light emitting devices, one red, one green, one light blue and one deep blue, may be used to render any color inside the shape defined by the CIE coordinates of the light emitted by the devices on a CIE chromaticity diagram.

Similarly, an embodiment of the invention may include pixels having red, green, blue, and infra-red sub-pixels, where an infra-red sub-pixel has a peak emission wavelength in the range of 800-2000 nm. Such a device may be useful when a user wishes to avoid detection.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

According to embodiments of the disclosed subject matter, a sunlight readable and wearable OLED device is provided. The device may include an anode, a cathode, and an organic emissive layer disposed between the anode and the cathode. The organic emissive layer may include a host and a dopant, such as a phosphorescent dopant.

A device configured in accordance with embodiments of the present invention may contain one or more sunlight readable displays. The display screen on a sunlight readable display should be bright enough so that the display is visible outdoors and under strong sunlight. Additionally, the display contrast ratio should be maintained at 5 to 1 or higher. For a self-emissive OLED, the contrast ratio is theoretically infinite, and therefore the main requirement is to achieve a high brightness. To remove reflection from the OLED device it is common to add or attach a circular polarizer to the outside of the flexible display. A truly sunlight readable display is typically considered to be an LCD with 1000 $cd/m^2$ or greater. This is equivalent to an OLED display with 700 $cd/m^2$ or greater. In outdoor environments under the shade, such a display can provide an excellent image quality.

A device configured in accordance with embodiments of the present invention may be wearable. As disclosed herein, the temperature of a wearable device should not rise to a temperature high enough to harm or discomfort an individual wearing the device. A wearable device as disclosed herein is typically considered to have a temperature no higher than 60° C. Additionally, the wearable display size should be physically manageable such that an individual can wear it on their bodies. Furthermore, the wearable device should be conformably worn on a human body and be lightweight. According to an embodiment of the disclosed subject matter, the largest dimension on a wearable device is typically considered to be no larger than 10 inches. Alternatively, the wearable device may have a dimension larger than 10 inches, however, the wearable device may be flexible and light enough to be worn on a human body.

Conventional OLEDs typically are limited in scope such that they are not sunlight readable, not wearable, or both. As illustrated in the experimental data provided herein, operation of conventional OLED devices in sunlight readable conditions may cause a rise in temperature of greater than 40° C., causing the actual temperature of the device to rise above a wearable threshold. Accordingly, the device would not be fit for operation in a wearable sunlight readable manner. For example, if a conventional OLED device is operated with an ambient room temperature of 25° C. and exhibits an operating temperature increase of 40° C. when driven at a sunlight readable luminance, the resulting actual temperature of the device equals 65° C. The actual temperature of 65° C. is above the general 60° C. threshold for a wearable device and thus the device would not be considered "wearable." Additionally, it is notable that in conditions where a device is exposed to sunlight, the ambient temperature can be significantly higher than 25° C. Therefore, it is likely for a conventional OLED device operating during exposure to sunlight, at a sunlight readable luminance, to be well above the general threshold for wearable devices.

OLED devices have an operational lifetime which is defined as the operational hour when the luminance of the device degrades to certain degree of the initial luminance. For example, the total hours for an OLED to operate till its luminance drops to 70% of the initial luminance is defined as LT70. An OLED having LT70 of 30,000 hrs at 1,000 $cd/m^2$ means the device can operate 30,000 hrs before the luminance degrades to 700 $cd/m^2$, which is 70% of the initial luminance 1,000 $cd/m^2$. The lifetime of OLED is affected by the operational temperature. Typically, for an OLED device, a 10 degree higher operational temperature may lead to a 1.5× reduction in device lifetime. For example, an OLED device may have a LT70 of 30,000 hours at 1,000 $cd/m^2$ at an operational temperature of 25° C. However, the same OLED device may have a LT70 for 20,000 hours at 1,000 $cd/m^2$ if it is operated at an average temperature of 35° C. throughout its lifetime.

According to embodiments of the present invention, a wearable device may include at least one flexible display with at least one phosphorescent emissive layer. A flexible display is described in detail in U.S. Pat. No. 6,664,137, the disclosure of which is incorporated herein by reference in its entirety. Preferred flexible substrate layers contain paper, fabric, metal foil, flexible glass layers (available, for example, from Schott Glass Technologies), and/or polymer layers, or the like. A phosphorescent emissive layer can be configured in accordance with the techniques disclosed herein. The flexible display of the wearable device may be capable of operation at a sunlight readable luminance value (e.g., 700 cd/m$^2$). Furthermore, according to embodiments of the present invention, the flexible display may not experience an operating temperature increase of more than 26° C. to remain wearable. An operating temperature increase may be an increase in temperature due to the heat generated by the display. The display may generate heat due to factors such as, but not limited to, frictional force, vibrations, current flow, energy conversion, or the like. For example, a flexible display may experience a rise in operating temperature due to the inefficient device operation where part of the energy was converted into heat instead of generating light. An increase in temperature due to ambient conditions may not be considered in calculating an operating temperature increase. Such ambient conditions may include, but are not limited to, body heat, sunlight, weather conditions, external air flow, external flames, or the like. For example, if a display is operated with an initial ambient temperature of 25° C. and the ambient temperature increases to 30° C. within an hour of operation, then the 5° C. increase in ambient temperature should not be a factor in calculating the operating temperature rise. In the same example, if the overall temperature of the display increases to 50° C. after an hour of operation, the rise in operating temperature is 20° C. (50° C. minus 30° C.).

In an embodiment of the invention, a display configured to be wearable and sunlight readable may be attained by using at least one phosphorescent emissive layer and by operating the display at an efficiency of at least about 30 cd/A, more preferably 45 cd/A at a sunlight readable luminance level. A higher efficiency typically results in a smaller operating temperature rise, and, thus, may be more desirable. For example, a display with an emissive layer that emits light with a peak emission wavelength of about 580-700 nm operating at an efficiency of 30 cd/A at a sunlight readable luminance level, may experience an operating temperature rise of 29° C. or less. At the same luminance level, the display with an efficiency of 45 cd/A may experience a more preferable operating temperature rise of 26° C. or less. The smaller operating temperature rise can result in a longer lifetime as disclosed herein. Additionally, as disclosed herein, the resulting lower operating temperature may also increase the wearability of a device by maintaining an overall lower device temperature.

In an embodiment, the display may be a full color display with an operating power consumption density of not more than about 78 mW/cm$^2$ when operating at 700 cd/m$^2$ at 100% full white. More preferably, the display may have an operating power consumption density of not more than about 65 mW/cm$^2$ when operating at 700 cd/m$^2$ at 100% full white. A full color display can be configured in accordance with the standards disclosed herein. In particular, these standards call for saturated red, green, and blue pixels. Color may be measured using CIE coordinates, which are well known in the art. 100% full white may refer to emitting from all available pixels, which, generally, results in white visible light. As an example, a display containing phosphorescent red, green, and blue emissive layers can operate to display a sunlight readable all white output while maintaining an average power consumption density of about 65 mW/cm$^2$.

In an embodiment, a sunlight readable wearable display may include multiple organic light-emitting devices arranged into pixels that have a combined resolution of at least 200 dpi. As used herein, the "combined resolution" of a set of pixels refers to the resolution of a display, screen, or similar device that incorporates the pixels, as will be readily understood by one of skill in the art. If the display has sub-pixels of different colors then the combined resolution would apply to pixels that contain all the sub-pixels.

In an embodiment, a display may be dimmed such that the brightness of the display is at a level below a previous brightness level. For example, a sunlight readable display operating at 700 cd/m$^2$ or greater may dim its luminance such that the display outputs 400 cd/m$^2$. The display may dim its brightness output based on a factor such as, but not limited to, the amount of battery power available to the device, a user selected setting, a time, a location, the content displayed on the device, or a combination thereof. Dimming the display based on battery power may result from a preset setting which evaluates a ratio, percentage, or amount of battery available. The preset setting may be user selected or be preset by a manufacturer. For example, a device may be set to dim the display if 20% or less of the overall battery power is available. Dimming the display based on a user setting may result from a user manually selecting a lower brightness level or by a user selecting an available option which dynamically lowers the brightness based on the option settings. For example, the device may dim between the hours of 17:00 and 6:00 based on a user selection. Alternatively, the device may be set to dim during hours when, generally, there is no daylight. A device location may be determined using an applicable location detection technique such as, but not limited to, triangulation, geolocation tracking, user input, or the like. For example, a user may configure the device to dim the display when the display is within 100 yards from a specific building. A device may be configured to dim its display based on display content. For example, the display may dim if a movie marked as private is being displayed.

The display may also be dimmed based on an ambient condition. Ambient conditions can include, but are not limited to, ambient light, ambient temperature, ambient sound, devise position and the like. The ambient condition may be detected using a sensor such as a light sensor, temperature sensor, sound sensor, accelerometer or other motion sensor, a position sensor, an orientation sensor or the like. For example, a light sensor in the device may detect that the ambient brightness corresponds to an unlit environment (e.g., at night, indoor, or the like). Accordingly, the device may dim the display operating at 700 cd/m$^2$ or greater to output 400 cd/m$^2$. Similarly, as another example, a device may dim its display to a lower brightness value if the device detects that its temperature is above a certain threshold. The temperature-based dimming may effectively help maintain a desired temperature for the device as a lower luminance can correspond to a lower operating temperature. Similarly, as another example, a device may dim its display to a lower brightness value if the device receives a predetermined sound. Here, sound may be a user verbally outputting a phrase such as "Dim device". In another example, an accelerometer, motion sensor, position sensor, orientation sensor or a combination of thereof may provide respective sensor data to the device. The data may indicate that the display is not currently being used by a user, such as a wrist-worn device detecting that the user likely is holding his wrist at his side and, therefore, is not using the device. Accordingly, the display may be dimmed until the sensor data indicates that the display is being used by a user.

In an embodiment, a device may include a touch sensitive surface. The touch sensitive surface may allow heat based touch input, pressure based touch input, magnetic based touch input, chemical based touch input, or the like, or a combination thereof. For example, a user may use a finger or a stylist to interact with the device. The device may accept multiple touch inputs such that two or more touch based inputs may result in predefined results. For example, the device may be configured to associate a single touch with a single click and a double simultaneous touch with a double click. The device may also accept gestures based on touch. The gestures can include, but are not limited to, movement while maintaining contact, movement during multiple points of contact, tapping, altering a pressure, or the like, or a combination thereof. For example, a user may perform a pinch like gesture with two fingers while maintain contact with the device. A zoom out action may result from the pinch like gesture.

In an embodiment, a device may contain a backplane fabricated on a substrate. The substrate may be composed of any applicable material including, but not limited to, plastic, metal, glass, thin metal (700 μm or less, more preferably 500 μm or less), thin glass (200 μm or less, more preferably 100 μm or less) or the like, or a combination thereof. In an embodiment, the display of the device may be encapsulated by a single layer barrier in accordance with techniques disclosed herein.

According to embodiments of the invention, a display may be fabricated by depositing or otherwise fabricating various layers in a vertical stack. For example, in an embodiment an AMOLED may be fabricated by depositing a first organic emissive layer capable of being operated at an efficiency of 30 cd/A at a sunlight readable luminance level. A second emissive layer operating at a comparable efficiency may be deposited in a stacked formation relative to the first emissive layer. Alternatively, a second emissive layer may be deposited in a parallel formation relative to the first emissive layer. The organic light emitting device may be fabricated using vacuum thermal evaporation, ink-jet printing, OVJP or similar patterning techniques, and may include a colored OLEDs, such as R, G, B, or R, G, light blue and deep blue and/or a white OLED with a color filter (CF). A display may be manufactured using a white plus CF architecture such that red, blue and green emissive layers are organized in a vertical stack and emit a white light when driven simultaneously or in temporal proximity. The white plus CF architecture may result in a higher resolution display.

In embodiments of the invention, the wearable device can be lightweight and slender such that it may weigh less than 140 grams and more preferably 95 grams and may contain at least one dimension no more than 15 mm, and more preferably 8 mm thick. Notably, being lightweight and slender can result in higher wearability for a device. For example, a flexible mobile phone weighing 94 grams and having a depth of 7.5 mm may be capable of operating a display with sunlight readability. As a result of the increased wearability, a user may easily affix the device on his/her wrist using a fastening mechanism and operate the device in various visibility conditions, directly from his/her wrist. Further, the device may contain a thin film battery. The thin film battery may be smaller than the device and may be contained within the housing of the device. The housing may also contain a solar cell to generate power to re-charge a battery.

EXPERIMENTAL

Figure 3:
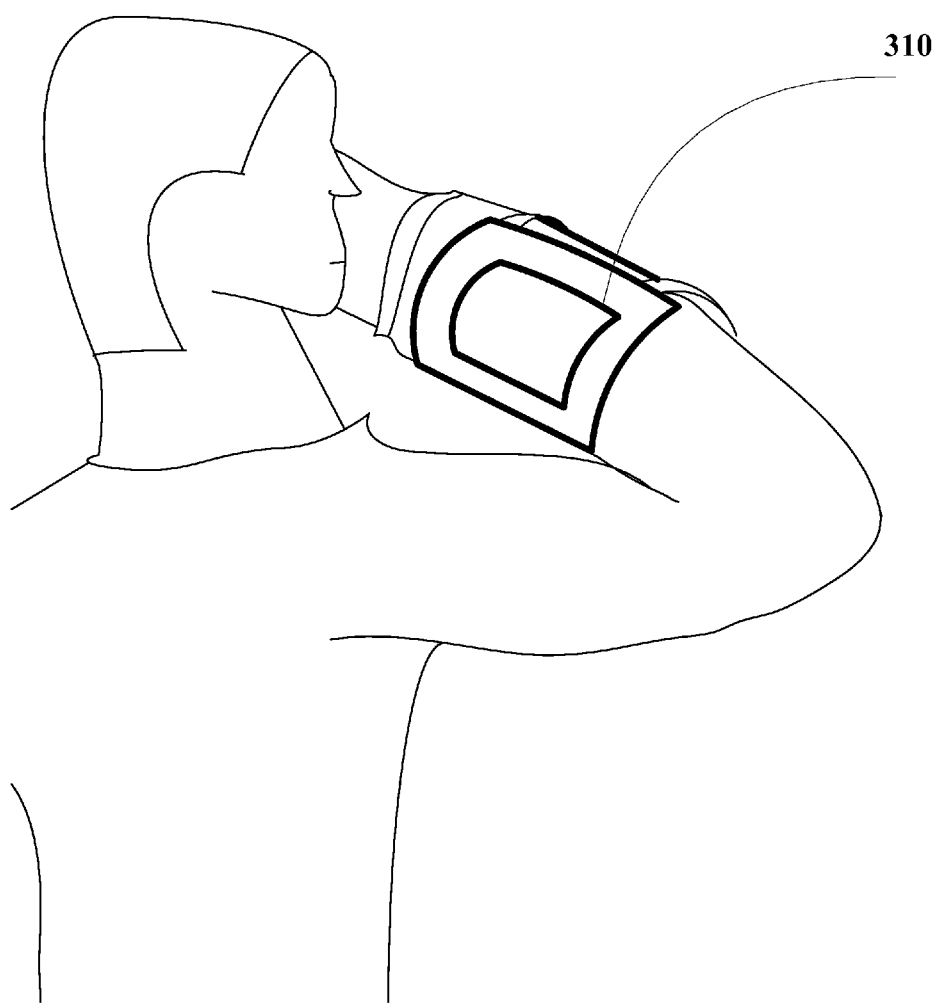
FIG. 3 shows a user wearing a flexible wearable display device according to an embodiment of the invention.

FIG. 3 shows an image of an example flexible display wrist unit 310. A unit similar in physical dimensions to the illustrated unit 310 was used for the following measurements. The tested unit including a 4.3" HVGA OLED display with 134 dpi (480×320×RGB) resolution, fabricated on stainless steel foil substrate, was used to conduct the test. The flexible display was bent into approximately a 4 cm radius, and was housed to fit on human wrist. The wrist display included a USB interface connector for power input and a DVI interface connector for video input. Input power was 5V DC voltage with less than 0.5A current.

Temperature measurement of the wrist display was performed in a constant ambient temperature To of 23.5° C. The display was driven at full white. The initial luminance was measured at 80.5 cd/m$^2$, with CIE 1931 color coordinates of (0.251, 0.390). Luminance and color coordinates were measured at the center of the display at normal incidence using a chroma meter. Temperatures were measured at the same spot on the display using a thermometer with a thermocouple that touched the surface to be measured. Additionally, temperatures were also measured at the back side of the housing where, generally, a user may be in contact with the wrist unit. Luminance and temperature were monitored over time. The temperature rise of the device, defined as $\Delta T = T - T_o$, where T is the measured absolute temperature, and $T_o = 23.5°$ C., was determined.

Figure 4:
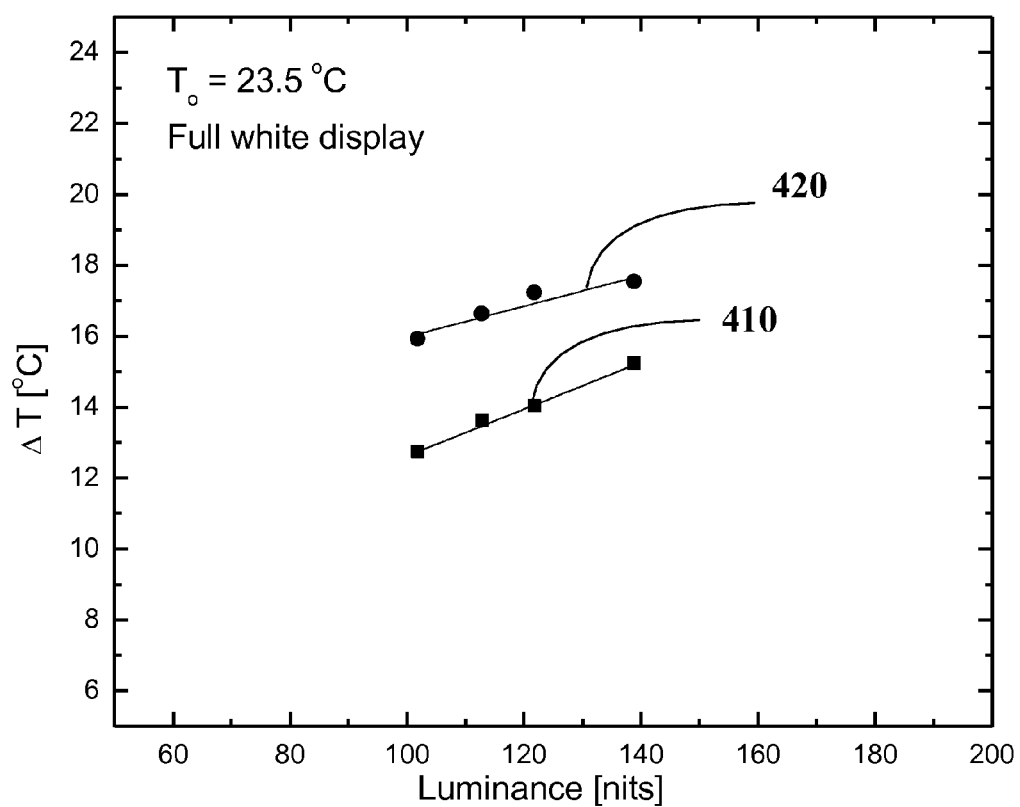
FIG. 4 shows a plot of the relationship between the temperature rise of a display surface and the backside of a housing as a function of display luminance.

FIG. 4 is a plot that shows the relationship between the temperature rise of the display surface and the backside of the housing as a function of display luminance. The plot shows a near linear dependence of the temperature on the luminance for both the display surface and the back side of the housing. A trend curve consistent with the equation $\Delta T = a + bL$ can be plotted to fit the relationship between the display temperature and luminance. For the display surface, the fit value a was calculated as 6.012 and b as 0.066. Based on the trend curve 410, at 700 cd/m$^2$ (i.e., sunlight readable luminance), $\Delta T$ is then 52.2° C. Given that $T_o = 23.5°$ C., the actual display surface temperature T was determined to be 75.7° C. This surface display temperature is too high for a wearable device. For the back side display, the fit value a was calculated as 11.66 and b as 0.0432. Based on the trend curve, at 700 cd/m$^2$ (i.e., sunlight readable luminance), $\Delta T$ is 41.9° C. and, thus, T for the back side is 65.4° C. This back side temperature is also too high for a wearable device. Table 1 shows the power consumption of two such traditional displays operated at 18.3 volts and current of 25.4 mA and 31.4 mA at a luminance of 100 cd/m$^2$. The relatively high power consumptions of 0.465 W and 0.575 W, respectively, correspond to temperature rises rendering a device un-wearable when operated at daylight readable luminance of 700 cd/m$^2$.

TABLE 1

| | Full white at 100 cd/m$^2$ | | |
|---|---|---|---|
| Sample # | Voltage | Current | Power |
| 1 | 18.3 V | 25.4 mA | 0.465 W |
| 2 | 18.3 V | 31.4 mA | 0.575 W |

Power consumption of a device as disclosed herein operating under the same luminance (i.e., fill white at 100 cd/m$^2$), was simulated, and determined to be only 257 mW, versus an average of 520 mW for the traditional, less efficient, display. Assuming that the temperature rise of a display is proportional to its power consumption, the temperature would only rise about 26° C. Thus the simulated display would operate at less than approximately 50° C. at sunlight readable luminance (700 cd/m$^2$).

It was also found that the simulated display had an operating temperature at 700 cd/m² of 26° C. less than the previous display, representing an approximate 3× improvement in display lifetime.

Table 2 shows an analysis of the simulated new display made in accordance with embodiments of the present invention.

TABLE 2

| Attribute | Value | Unit |
|---|---|---|
| Green | 110 | cd/A |
| Red | 45 | cd/A |
| Blue | 5.5 | cd/A |
| Pixl capacitance | 2.20E−08 | F/cm² |
| OLED Voltage | 3.58 | V |
| Vth | 3.80 | V |
| KuW/L | 1.00 | uA |
| TFT Voltage | 3.42 | V |
| Polarizer Efficiency | 44% | % |
| Green component | 62% | % |
| Red component | 27% | % |
| Blue component | 11% | % |
| % pixel on | 100% | % |
| Display Specs | | |
| Width | 9.51375 | cm |
| Height | 5.3535 | cm |
| Brightness | 100 | cd/m² |
| Sub-pixel FF | 40% | % |
| Refresh rate | 60 | Hz |
| Display resolution | 100 | ppi |
| Sub pixel area | 8.60E−05 | cm² |
| Green brightness | 1,057 | cd/m² |
| Red brightness | 460 | cd/m² |
| Blue brightness | 188 | cd/m² |
| Green power | 0.046 | W |
| Red power | 0.049 | W |
| Blue power | 0.162 | W |
| Capactive power | 4.31E−04 | W |
| Total Power | 0.257 | W |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A wearable device comprising:
a flexible display comprising a phosphorescent first emissive layer;
wherein the display is capable of operation at a luminance value of at least 700 cd/m² without exceeding an operating temperature increase of 26° C.

2. The device as recited in claim 1, wherein the display comprises a plurality of pixels with a combined resolution of at least 200 dpi.

3. The device as recited in claim 1, further comprising a second emissive layer having a peak emission wavelength different from the first emissive layers.

4. The device as recited in claim 3, further comprising a third emissive layer having a peak emission wavelength different from the first and second emissive layers.

5. The device as recited in claim 4, wherein the second emissive layer has a deep blue peak emission wavelength, and wherein the third emissive layer has a light blue peak emission wavelength.

6. The device as recited in claim 4, further comprising a fourth organic emissive layer having a peak emission wavelength different from the first, second, and third emissive layer.

7. The device of claim 6, wherein the fourth organic emissive layer has an infra-red emission wavelength.

8. The device of claim 6, wherein the fourth organic emissive layer has a light blue emission wavelength.

9. The device of claim 6, wherein the fourth organic emissive layer has a dark blue emission wavelength.

10. The device as recited in claim 1, wherein the display dims to operate at a luminance value less than 700 cd/m² based on ambient lighting conditions.

11. The device as recited in claim 1, wherein the display dims to operate at a luminance value less than 700 cd/m² based on one or more factors selected from the group consisting of: the amount of battery power available to the device, a user selected setting, a time, a location, a height, and the content displayed on the device.

12. The device as recited in claim 1, further comprising a touch sensitive surface.

13. The device as recited in claim 12, wherein the touch sensitive surface is responsive to multiple touch inputs.

14. The device as recited in claim 1, wherein a backplane of the display is fabricated on a substrate selected from the group consisting of a plastic substrate, a metal substrate, and a glass substrate.

15. The device as recited in claim 1, wherein a backplane of the display is fabricated on a substrate selected from the group consisting of a thin metal substrate and a thin glass substrate.

16. The device as recited in claim 1, wherein the display is encapsulated by a single layer barrier.

17. The device as recited in claim 3, wherein the first and second emissive layer are disposed in a vertical stack.

18. The device as recited in claim 17, further comprising a color filter disposed over the first and second emissive layers.

19. The device as recited in claim 1, wherein the display comprises a full-color display having an operating power consumption density of not more than about 78 mW/cm² when operating at 700 cd/m² at 100% full white.

20. The device as recited in claim 19, wherein the display has an operating power consumption density of not more than about 65 mW/cm² when operating at 700 cd/m² at 100% full white.

21. The device as recited in claim 1, wherein the device comprises a device type selected from the group consisting of: a full-color display, a flexible display in a consumer device, a mobile phone, a pad computer, a smartphone, a portable computer, a monitor, a television, and a consumer device including a flexible display.

22. The device as recited in claim 1, further comprising:
a second emissive layer disposed in a vertical stack with the first emissive layer;
a third emissive layer deposited in a vertical stack with the first emissive layer and the second emissive layer to form a white emissive stack; and
a color filter disposed in a vertical stack with the white emissive stack.

23. A wearable display system comprising:
a flexible display comprising an organic first emissive layer with a first peak wavelength operating at an efficiency of 30 cd/A at sunlight readable luminance level;
wherein the display is sunlight-readable; and
wherein the system exhibits an operating temperature rise of 29° C. or less.

24. The system as recited in claim 23, wherein the display operates at an efficiency of 45 cd/A, and the system exhibits an operating temperature rise of 26 C or less.

25. The system as recited in claim 23, wherein the first emissive layer has a peak emission wavelength of 580-700 nm.

26. The system as recited in claim 23, wherein the display comprises a plurality of pixels with a combined resolution of at least 200 dpi.

27. The system as recited in claim 23, further comprising a second organic emissive layer having a peak emission wavelength different from the organic first emissive layers.

28. The system as recited in claim 23, further comprising a third organic emissive layer having a peak emission wavelength different from the first and second emissive layers.

29. The system as recited in claim 28, wherein the second emissive layer has a deep blue peak emission wavelength, and wherein the third emissive layer has a light blue peak emission wavelength.

30. The system as recited in claim 28, further comprising a fourth organic emissive layer having a peak emission wavelength different from the first, second, and third emissive layer.

31. The system of claim 30, wherein the fourth organic emissive layer has an infra-red emission wavelength.

32. The device of claim 30, wherein the fourth organic emissive layer has a light blue emission wavelength.

33. The device of claim 30, wherein the fourth organic emissive layer has a dark blue emission wavelength.

34. The system as recited in claim 23, wherein the display dims to operate at a luminance value less than 700 cd/m$^2$ based on ambient lighting conditions.

35. The system as recited in claim 23, wherein the display dims to operate at a luminance value less than 700 cd/m$^2$ based on one or more factors selected from the group consisting of: the amount of battery power available to the device, a user selected setting, a time, a location, a height, and the content displayed on the device.

36. The system as recited in claim 23, further comprising a touch sensitive surface.

37. The system as recited in claim 36, wherein the touch sensitive surface is responsive to multiple touch inputs.

38. The system as recited in claim 23, wherein a backplane of the display is fabricated on a substrate selected from the group consisting of a plastic substrate, a thin metal substrate, and a thin glass substrate.

39. The system as recited in claim 23, wherein the display is encapsulated by a single layer barrier.

40. The system as recited in claim 27, wherein the first and second emissive layer are disposed in a vertical stack.

41. The system as recited in claim 40, further comprising a color filter disposed over the first and second emissive layers.

42. The system as recited in claim 23, wherein the display comprises a full-color display having an operating power consumption density of not more than about 78 mW/cm$^2$ when operating at sunlight readable luminance conditions.

43. The system as recited in claim 42, wherein the display has an operating power consumption density of not more than about 65 mW/cm$^2$ when operating at sunlight readable luminance conditions.

44. The system as recited in claim 23, wherein the device comprises a device type selected from the group consisting of: a full-color display, a flexible display in a consumer device, a mobile phone, a pad computer, a smartphone, a portable computer, a monitor, a television, and a consumer device including a flexible display.

45. The system as recited in claim 23, wherein the device weighs no more than 95 grams.

46. The system as recited in claim 23, wherein the device weighs no more than 140 grams.

47. The system as recited in claim 23, wherein the device comprises at least one dimension which is no more than 8 mm thick.

48. The system as recited in claim 23, wherein the device comprises at least one dimension which is no more than 15 mm thick.

49. The system as recited in claim 23, further comprising a processor adapted to operate the display.

50. The system as recited in claim 23, further comprising a thin film battery.

51. The system as recited in claim 23, further comprising a solar cell.

52. The system as recited in claim 23, further comprising at least one sensor selected from the group consisting of an accelerometer, temperature sensor, sound sensor, a motion sensor, a position sensor, a light sensor and an orientation sensor.

53. The system as recited in claim 52, wherein the system is configured to enter a power save mode based on the input of the at least one sensor.

54. The system as recited in claim 52, wherein the at least one sensor is configured to increase the luminance of the display based on a change in sensor input.

55. The system as recited in claim 23, further comprising:
a second emissive layer disposed in a vertical stack with the first emissive layer;
a third emissive layer deposited in a vertical stack with the first emissive layer and the second emissive layer to form a white emissive stack; and
a color filter disposed in a vertical stack with the white emissive stack.

* * * * *